(12) United States Patent
Kang et al.

(10) Patent No.: US 8,125,040 B2
(45) Date of Patent: Feb. 28, 2012

(54) TWO MASK MTJ INTEGRATION FOR STT MRAM

(75) Inventors: Seung H. Kang, San Diego, CA (US); Xia Li, San Diego, CA (US); Shiqun Gu, San Diego, CA (US); Matthew Nowak, San Diego, CA (US)

(73) Assignee: QUALCOMM Incorporated, San Diego, CA (US)

(*) Notice: Subject to any disclaimer, the term of this patent is extended or adjusted under 35 U.S.C. 154(b) by 183 days.

(21) Appl. No.: 12/405,461

(22) Filed: Mar. 17, 2009

(65) Prior Publication Data
US 2009/0261437 A1 Oct. 22, 2009

Related U.S. Application Data

(60) Provisional application No. 61/046,167, filed on Apr. 18, 2008.

(51) Int. Cl.
*H01L 29/82* (2006.01)

(52) U.S. Cl. ............ 257/422; 257/421; 257/E21.002; 257/E29.323; 438/3; 365/51; 365/66; 365/158; 365/171; 365/172; 365/173; 365/203; 360/324.2

(58) Field of Classification Search .......... 257/421, 257/422, E21.002, E29.323; 438/3; 365/51, 365/66, 158, 171–173, 203; 360/324.2
See application file for complete search history.

(56) References Cited

U.S. PATENT DOCUMENTS

| | | | |
|---|---|---|---|
| 6,759,263 B2 | 7/2004 | Ying et al. | |
| 6,911,156 B2 | 6/2005 | Grynkewich et al. | |
| 7,092,283 B2 * | 8/2006 | Jeong et al. | 365/158 |
| 7,259,062 B2 | 8/2007 | Lee | |
| 7,285,836 B2 * | 10/2007 | Ju et al. | 257/421 |
| 7,394,626 B2 * | 7/2008 | Fukumoto et al. | 360/324.2 |
| 7,582,941 B2 * | 9/2009 | Cho et al. | 257/421 |

(Continued)

FOREIGN PATENT DOCUMENTS

EP 1689006 8/2006
(Continued)

OTHER PUBLICATIONS

International Search Report—PCT/US09/040612, International Search Authority—European Patent Office—Jul. 17, 2009.

(Continued)

*Primary Examiner* — Lynne Gurley
*Assistant Examiner* — Meiya Li
(74) *Attorney, Agent, or Firm* — Sam Talpalatsky; Nicholas J. Pauley; Jonathan T. Velasco

(57) ABSTRACT

A method for forming a magnetic tunnel junction (MTJ) for magnetic random access memory (MRAM) using two masks includes depositing over an interlevel dielectric layer containing an exposed first interconnect metallization, a first electrode, a fixed magnetization layer, a tunneling barrier layer, a free magnetization layer and a second electrode. An MTJ structure including the tunnel barrier layer, free layer and second electrode is defined above the first interconnect metallization by a first mask. A first passivation layer encapsulates the MTJ structure, leaving the second electrode exposed. A third electrode is deposited in contact with the second electrode. A second mask is used to pattern a larger structure including the third electrode, the first passivation layer, the fixed magnetization layer and the first electrode. A second dielectric passivation layer covers the etched plurality of layers, the first interlevel dielectric layer and the first interconnect metallization.

16 Claims, 4 Drawing Sheets

U.S. PATENT DOCUMENTS

| | | | | |
|---|---|---|---|---|
| 2002/0186514 A1* | 12/2002 | Childress et al. | ......... | 360/324.2 |
| 2005/0090111 A1* | 4/2005 | Lee | ............... | 438/700 |
| 2005/0205952 A1* | 9/2005 | Park et al. | ..................... | 257/421 |
| 2006/0261425 A1* | 11/2006 | Suemitsu et al. | ............. | 257/421 |
| 2007/0076330 A1* | 4/2007 | Chung et al. | ............... | 360/324.2 |
| 2007/0164265 A1* | 7/2007 | Kajiyama | ................... | 257/3 |
| 2007/0230242 A1* | 10/2007 | Lee et al. | ..................... | 365/173 |
| 2008/0080233 A1* | 4/2008 | Hosotani et al. | .............. | 365/158 |
| 2008/0180991 A1* | 7/2008 | Wang | ............................ | 365/171 |
| 2008/0266943 A1* | 10/2008 | Yang et al. | ................... | 365/171 |
| 2009/0209050 A1* | 8/2009 | Wang et al. | ....................... | 438/3 |
| 2009/0246557 A1* | 10/2009 | Horng et al. | ................ | 428/811.1 |
| 2009/0251950 A1* | 10/2009 | Klostermann | ................ | 365/158 |

FOREIGN PATENT DOCUMENTS

| | | |
|---|---|---|
| EP | 1860769 | 8/2007 |

OTHER PUBLICATIONS

Written Opinion—PCT/US09/040612, International Search Authority—European Patent Office—Jul. 17, 2009.

\* cited by examiner

_US 8,125,040 B2_

TWO MASK MTJ INTEGRATION FOR STT MRAM

CROSS REFERENCE TO RELATED APPLICATION

This application claims the benefit of U.S. provisional patent application No. 61/046,167, "TWO MASK MTJ INTEGRATION FOR STT MRAM" by Seung H. Kang, et al., filed Apr. 18, 2008.

TECHNICAL FIELD

This disclosure relates to magnetic random access memory, and in particular, to spin torque transfer magnetic random access memory and methods of integration with standard integrated circuit fabrication processes.

BACKGROUND

Unlike conventional random access memory (RAM) chip technologies, in magnetic RAM (MRAM) data is not stored as electric charge, but is instead stored by magnetic polarization of a storage element—a magnetic tunnel junction, i.e., an MTJ. The elements are formed from two ferromagnetic plates, each of which can hold a magnetic field, separated by a thin insulating layer. One of the two plates is a permanent magnet set to a particular polarity; the magnetization polarity of the other "writable" plate will change to match that of a sufficiently strong external field. A memory device is built from a grid of such "cells".

Reading is accomplished by measuring the electrical resistance of the cell. A particular cell is conventionally selected by powering an associated transistor which switches current from a supply line through the cell to ground. Due to the tunneling magnetoresistance effect, the electrical resistance of the cell changes due to the orientation of the fields in the two plates. By measuring the resulting current, the resistance inside any particular cell can be determined, and from this the polarity of the writable plate. Conventionally, if the two plates have the same polarity this is considered a state "0", whereas if the two plates are of opposite polarity the resistance will be higher and is considered a state "1".

One significant determinant of a memory system's cost is the density of the components. Smaller components, and fewer components per "cell," mean that more "cells" may be packed onto a single chip, which in turn means more chips can be produced at once from a single silicon wafer and fabricated at lower cost and improved yield.

In addition, the manufacturing process flow affects cost, with more mask processes contributing to increased overall manufacturing costs. When fabrication of conventional MRAM requires a number of mask processes dedicated solely to the fabrication of the magnetic tunnel junction (MTJ) structure, costs are further increased. Because processing cost is a serious consideration in implementing integration of features in an integrated circuit device, any improvement in the design and process flow that eliminates masks and associated processes is advantageous. A difference in one mask process can save significant costs. Accordingly, there is a need for improved methods for integrating MRAM fabrication in the semiconductor manufacturing process flow. Moreover, any design that relaxes alignment of critical dimension features would be desirable.

SUMMARY

A method of integrating magnetic random access memory (MRAM) fabrication processes into standard back-end-of-line (BEOL) integrated circuit manufacturing using two photo mask processes.

In one aspect, a method for forming a magnetic tunnel junction (MTJ) device for magnetic random access memory (MRAM) using two masks includes depositing, on a substrate having a first interconnect metallization, a first electrode in communication with the first interconnect metallization, MTJ layers, and a second electrode. The method also includes defining at least some of the MTJ layers and the second electrode with a first mask; and depositing a third electrode on the second electrode. The method further includes defining the first electrode and the third electrode with a second mask larger than the first mask.

In another aspect, a magnetic tunnel junction (MTJ) structure for magnetic random access memory (MRAM) has a substrate with a first interconnect metallization. The structure also includes a first electrode coupled to the first interconnect metallization, and MTJ layers. At least one of the MTJ layers is coupled to the first electrode. The structure further includes a second electrode coupled to at least one other of the MTJ layers, the second electrode having a same lateral dimension as at least some of the MTJ layers based upon a first mask. The structure additionally includes a third electrode coupled to the second electrode, the third electrode having a same lateral dimension as the first electrode based upon a second mask. The structure also has a second interconnect metallization coupled to the third electrode.

In yet another aspect, a magnetic tunnel junction (MTJ) structure for magnetic random access memory (MRAM) includes a first interconnect means for communicating with at least one control device; a first electrode means for coupling to the first interconnect means; and an MTJ means for storing data. The MTJ means couples to the first electrode means. The structure further includes a second electrode means for coupling to the MTJ means, and a third electrode means for coupling to the second electrode means. The second electrode means has a same lateral dimension as the MTJ means based upon a first mask. The third electrode means has a same lateral dimension as the first electrode means based upon a second mask. The structure also has a second interconnect means for coupling to the third electrode means and at least one other control device.

The foregoing has outlined rather broadly the features and technical advantages of embodiments of the present disclosure in order that the detailed description of the disclosure that follows may be better understood. Additional features and advantages will be described hereinafter which form the subject of the claims of the disclosure. It should be appreciated by those skilled in the art that the conception and specific embodiment disclosed may be readily utilized as a basis for modifying or designing other structures for carrying out the same purposes of the present disclosure. It should also be realized by those skilled in the art that such equivalent constructions do not depart from the spirit and scope of the disclosure as set forth in the appended claims. The novel features which are believed to be characteristic of the disclosure, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following descriptions taken in conjunction with the accompanying drawings.

DETAILED DESCRIPTION

A magnetic tunnel junction (MTJ) device and method of forming the same are disclosed. In one embodiment, a spin-torque-transfer (STT) MTJ is disclosed.

Figure 1:
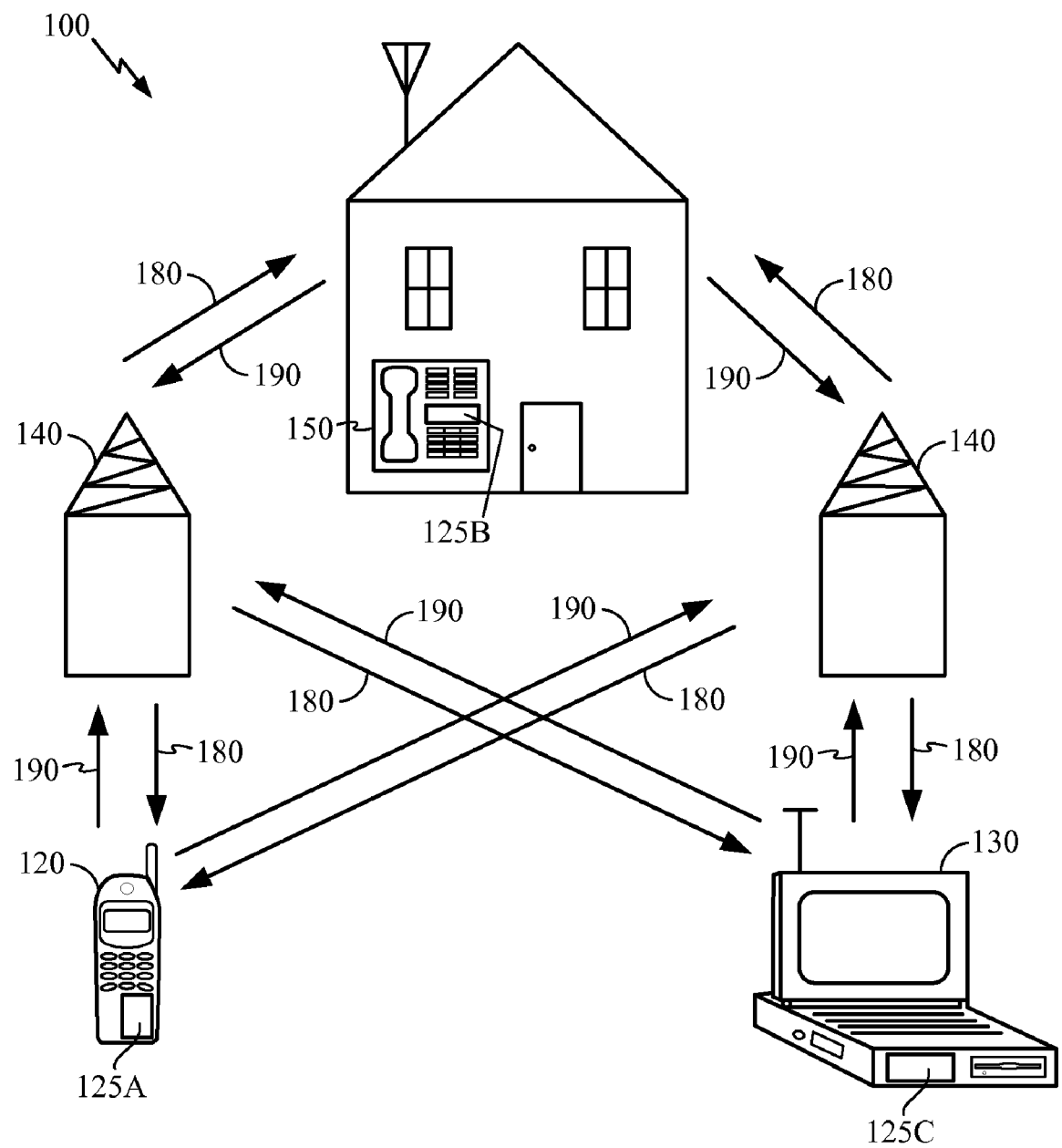
FIG. 1 is a block diagram showing an exemplary wireless communication system in which embodiments of the disclosure may be advantageously employed.

FIG. 1 shows an exemplary wireless communication system 100 in which an embodiment of the disclosure may be advantageously employed. For purposes of illustration, FIG. 1 shows three remote units 120, 130, and 150 and two base stations 140. It will be recognized that conventional wireless communication systems may have many more remote units and base stations. The remote units 120, 130, and 150 include STT MRAM devices 125A, 125B and 125C, which are an embodiment of the disclosure as discussed further below. FIG. 1 shows forward link signals 180 from the base stations 140 and the remote units 120, 130, and 150 and reverse link signals 190 from the remote units 120, 130, and 150 to the base stations 140.

In FIG. 1, the remote unit 120 is shown as a mobile telephone, the remote unit 130 is shown as a portable computer, and the remote unit 150 is shown as a fixed location remote unit in a wireless local loop system. For example, the remote units may be mobile phones, hand-held personal communication systems (PCS) units, portable data units such as personal data assistants, navigation devices (such as GPS enabled devices), set top boxes, music players, video players, entertainment units, fixed location data units such as meter reading equipment, or any other device that stores or retrieves data or computer instructions, or any combination thereof. Although FIG. 1 illustrates remote units according to the teachings of the disclosure, the disclosure is not limited to these exemplary illustrated units. The disclosed device may be suitably employed in any device which includes MRAM devices.

Figure 2:
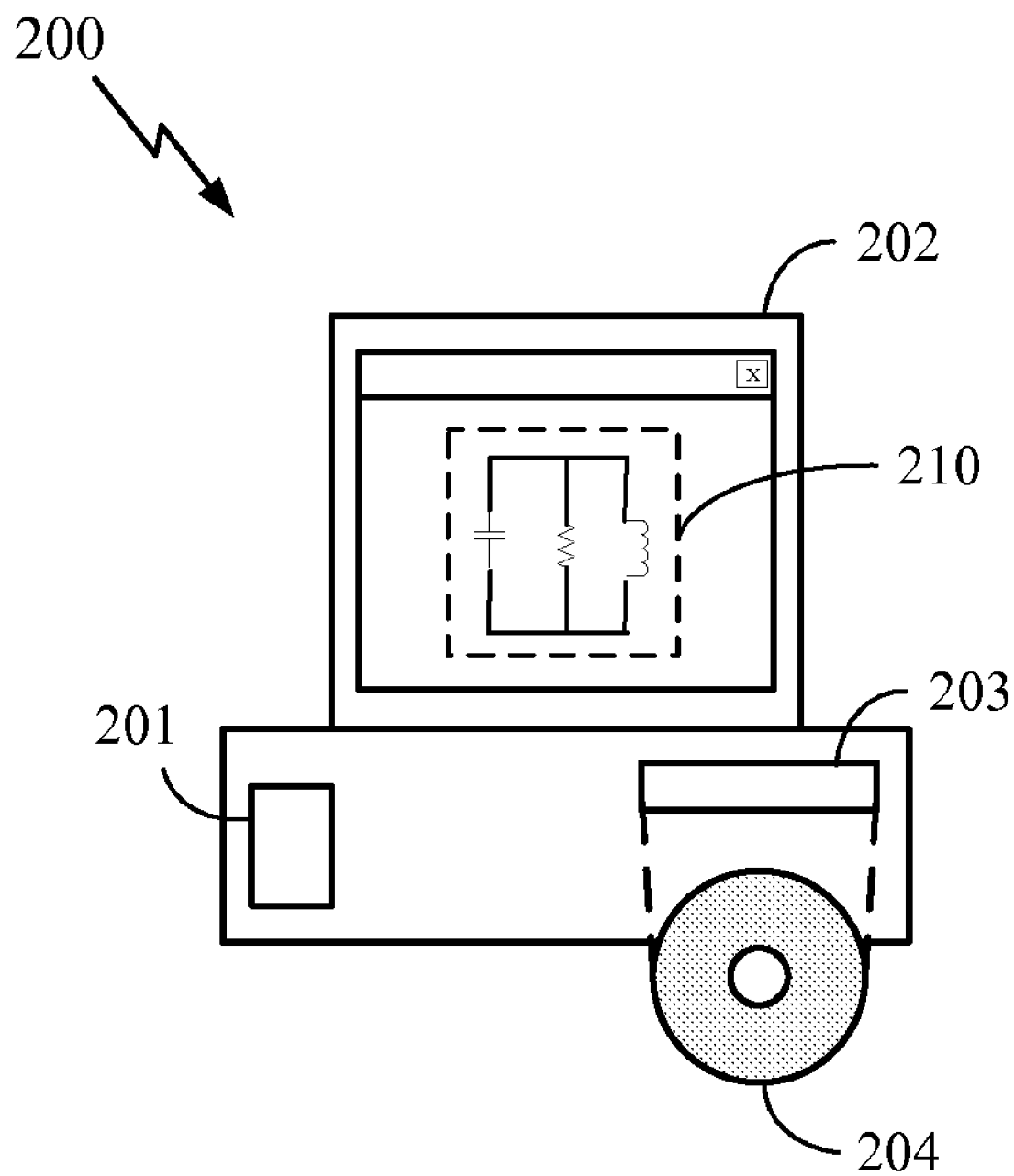
FIG. 2 is a block diagram illustrating a design workstation used for circuit, layout, logic design and integration of MRAM in a semiconductor back-end-of-line (BEOL) process flow, in accordance with an embodiment of the disclosure.

FIG. 2 is a block diagram illustrating a design workstation used for circuit, layout, and logic design of the disclosed semiconductor integrated circuit. A design workstation 200 includes a hard disk 201 containing operating system software, support files, and design software such as CADENCE or ORCAD. The design workstation 200 also includes a display 202 to facilitate design of a circuit design 210. The circuit design 210 may be the memory circuit as disclosed above. A storage medium 204 is provided for tangibly storing the circuit design 210. The circuit design 210 may be stored on the storage medium 204 in a file format such as GDSII or GERBER. The storage medium 204 may be a CD-ROM, DVD, hard disk, flash memory, or other appropriate device. Furthermore, the design workstation 200 includes a drive apparatus 203 for accepting input from or writing output to the storage medium 204.

Data recorded on the storage medium 204 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 204 facilitates the design of the circuit design 210 by decreasing the number of processes for designing semiconductor ICs.

In this disclosure an MRAM device and method of making the MRAM device utilize as little as two masks to form an MTJ. The method is applied substantially to making STT MRAM. This enables potentially large reductions in the cost of imbedding memory in an integrated circuit product.

Figure 3:
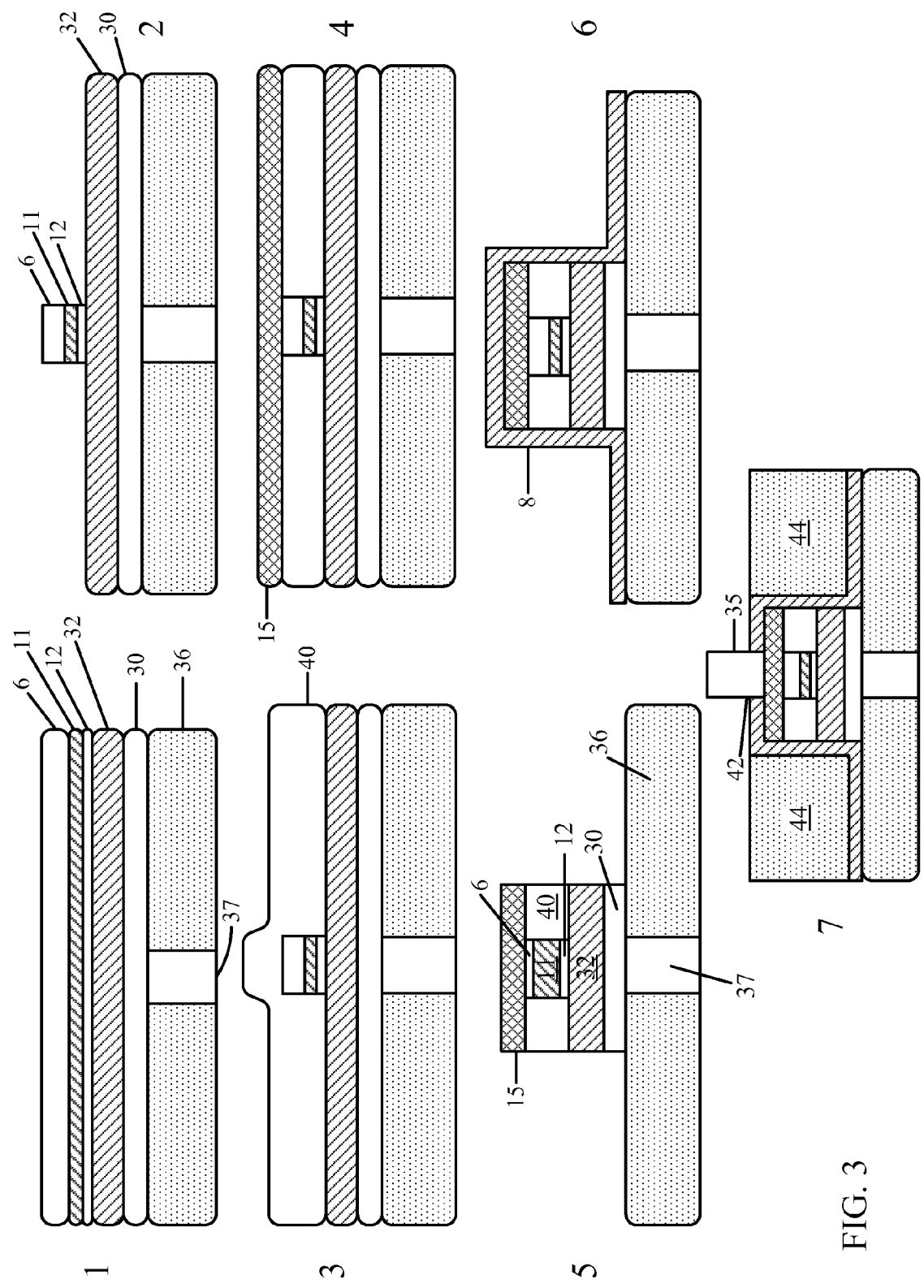
FIG. 3 is an exemplary schematic process flow for forming an MTJ structure that may be imbedded in a semiconductor back-end-of-line (BEOL) process flow, in accordance with an embodiment of the disclosure.

FIG. 3 is a schematic process flow of one embodiment of processing used to form an MTJ MRAM structure that may be imbedded in a semiconductor BEOL process.

An interlevel dielectric, ILD 36, separates MTJ layers from peripheral devices (not shown) that have been previously fabricated in a back-end-of-line (BEOL) process flow. An interconnect metallization 37 formed in the ILD 36 provides connection to the control devices (for example, an access transistor associated with an MTJ).

1: Beginning with a surface including the interconnect metallization 37 and the first ILD 36, a succession of layers are disposed on the surface, including a conductive first electrode 30, a reference fixed magnetic layer stack 32 (including a fixed antiferromagnetic layer and a synthetic antiferro-magnetic layer, neither of which are shown in FIG. 3), a tunnel barrier layer 12, a free layer 11, and a second electrode 6. In one embodiment, the interconnect metallization 37 connects an MTJ to a source line.

A conventional dielectric barrier between the ILD 36 and the first contact layer 30 is absent. To compensate for the loss of the conventional dielectric barrier, the first electrode 30 may be a refractory metal, such as, for example tantalum (Ta). The interconnect metallization 37 may be copper, and tantalum is an excellent barrier material for blocking diffusion of copper into surrounding materials. In other words, tantalum blocks diffusion of metals, such as copper, in the interconnect metallization 37, reducing or eliminating the need for the conventional dielectric barrier. Additionally, depositing a tantalum layer on the ILD 36 and the interconnect metallization 37 is a process friendly integration scheme common to complementary metal oxide semiconductor (CMOS) fabrication.

2: A first mask process is used to etch and pattern various upper layers and electrodes, including the tunnel barrier layer 12, the free layer 11 and the second electrode 6, but not including the reference fixed magnetic layer stack 32. In an alternative embodiment (discussed below), removal of a portion of and patterning the reference fixed magnetic layer stack 32 with the first mask may also take place. To continue, the core MTJ "stack" structure is defined, and includes the tunnel barrier layer 12, the free layer 11 and the conductive second electrode 6.

3: A dielectric passivation barrier 40 is disposed over the entire surface, including the MTJ stack. The dielectric passivation barrier 40 may be planarized (not shown) using, for example, chemical mechanical polishing (CMP) to expose the conductive second electrode 6.

4: A third electrode 15 is deposited over the planarized structure. As with the electrode metallization 30, 6, the electrode metallization 15 may be selected from various metals, including refractory metals such as tantalum (Ta).

5: A second mask process is used to etch and define the planar dimensions of the components including the third electrode 15, the dielectric passivation barrier 40 (surrounding the second electrode 6, the free layer 11, and the tunnel barrier layer 12), the reference fixed magnetic layer stack 32 and the first electrode 30, down to the surface defined by the ILD 36 and the interconnect metallization 37. It may be noted that alignment of the second mask is not subject to critical dimension registration, and there is considerable latitude in placement of the portions defined by the second mask, provided the second mask is generally positioned over the portions defined by the first mask and the interconnect metallization 37.

6: A passivation barrier layer 8 is deposited over the entire surface, including the defined MTJ stack. The passivation barrier layer 8, which may be, for example, silicon carbide or silicon nitride, is a very dense film for protecting against penetration by moisture or other species. The passivation barrier layer 8, therefore, encapsulates, passivates and protects the MTJ stack. Furthermore, the passivation barrier layer 8 is also a dielectric barrier that serves to protect the ILD 36 and can be used as an etch stop in CMOS processes, such as the fabrication of logic circuitry in subsequent BEOL processes. It should be noted that the conventional dielectric barrier reappears here, as the passivation barrier layer 8, but later in the process. The passivation barrier layer 8 has an additional function, as described below.

The various layers of dielectric barriers may be formed, for example, of metal oxides, metal carbides, or metal nitrides. For example, the barrier materials may be $SiO_x$, SiC, and SiN. The choice may be made, for example, based on requirements to be susceptible to or resistant to various etchants.

7: A second ILD 44 may be deposited to sufficiently bury the resulting structure, and then planarized to expose the passivation barrier layer 8. A standard metallization mask—that is now part of a BEOL process, and not specific to the MTJ integration process—is then used to define a trench 42, in the dielectric passivation barrier layer 8 to expose the third electrode 15. Another interconnect metallization 35, such as a bit line interconnect may be disposed in the hole 42 to communicate with the third electrode 15. The metal interconnect 35 may be copper or another conductive metal common to the BEOL process flow.

The ILD 44 separates the MTJ layers from peripheral devices (not shown) that can be fabricated in a subsequent portion of the BEOL process flow. The interconnect metalization 35 provides connection to devices fabricated in the subsequent portion of the BEOL process flow.

Figure 4:
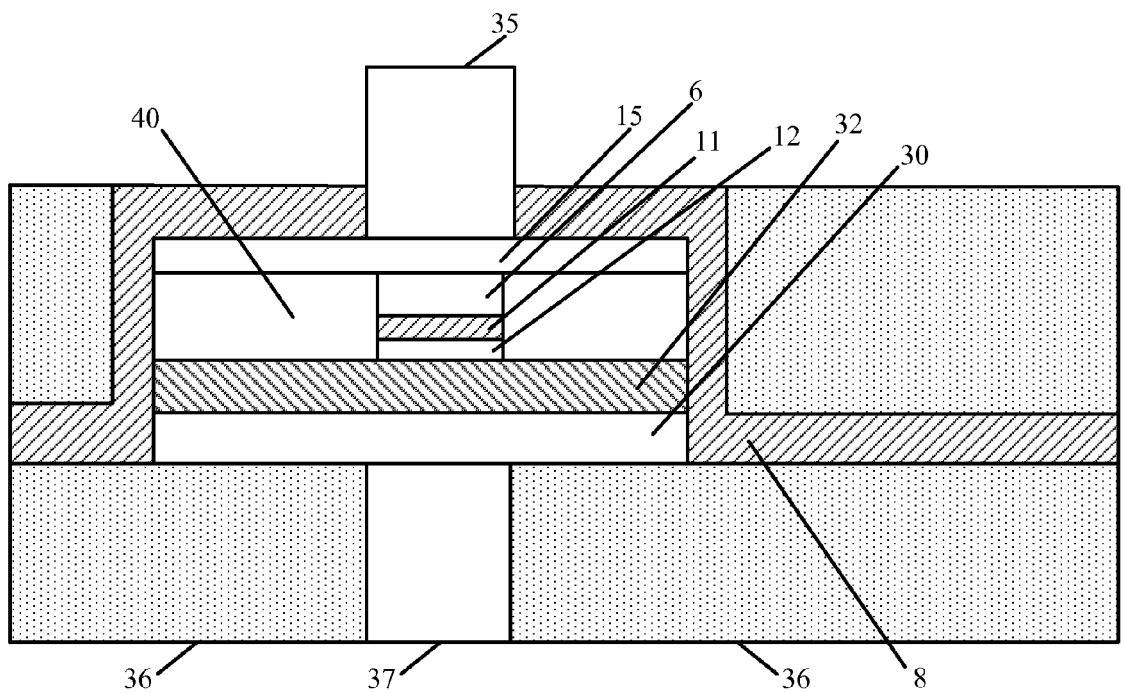
FIG. 4 is a cross-section view of an exemplary asymmetrical MTJ structure fabricated according to the embodiment of FIG. 3.
Figure 5:
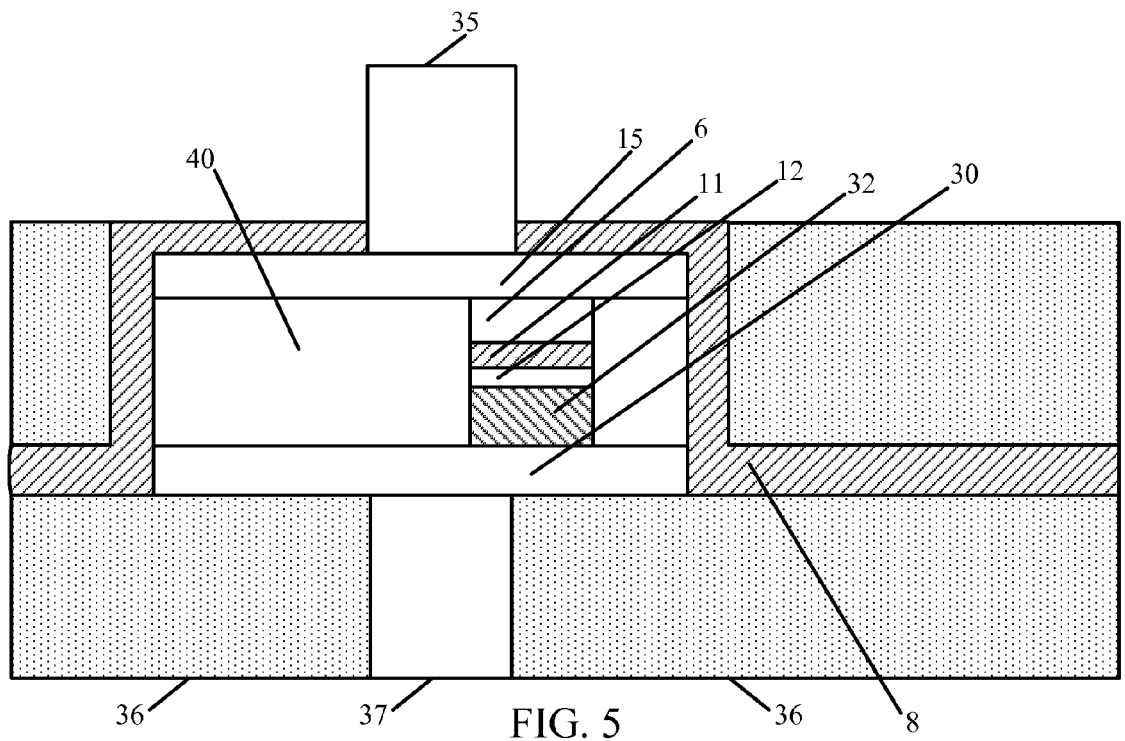
FIG. 5 is a cross-section view of an exemplary symmetrical MTJ structure fabricated according to the embodiment of FIG. 3.

Additionally, the MTJ stack does not have to be critically aligned with the interconnect metallization 37 or 35. That is, the MTJ can be positioned without requiring a registration critical dimension as long the MTJ stack elements 12, 11 and 6 are positioned between the patterned first electrode 30 and the third electrode 15. FIG. 4, in which the MTJ stack is shown centered over the interconnect metallization 37, is only for exemplary illustration. For example, as seen in FIG. 5, the MTJ stack can be off-center.

In the event that the polishing rates between such metals as the interconnect metallization 37 and such insulators as the ILD 36 are different, and polishing artifacts such as "dishing" occur, the first electrode 30 and/or the reference fixed magnetic layer stack 32 may be subsequently planarized, if needed, to provide a sufficiently flat surface for formation of the tunnel barrier layer 12 and the free layer 11 for control of layer thickness and quality, because these two layers (11 and 12) may be on the order of 1 nm.

The MTJ structure shown in FIG. 3 may be referred to as an asymmetrical MTJ. In the process flow of FIG. 3, the first mask is used to form the stack including the conductive second electrode 6, the free layer 11 and the tunnel barrier layer 12, but not the reference fixed magnetic layer stack 32 or the first electrode 30. The reference fixed magnetic layer stack 32 and the first electrode 30 are formed using the second mask.

As seen in FIG. 4, the same mask set may be used, however, to form an alternative MTJ structure described as "symmetrical." Thus, using the first mask, a "symmetric" structure may be achieved by extending the etch process to include the reference fixed magnetic layer stack 32, but not the first electrode 30. The first electrode 30 is patterned using the second mask, as before, i.e., in the "asymmetric" configuration. In this exemplary variant of the process flow, the first electrode 30 and the third electrode 15 only are identically patterned to symmetrically sandwich the intervening magnetic tunnel junction elements 32, 12, and 11 and the second electrode 6 between the first electrode 30 and the third electrode 15. The reference fixed magnetic layer stack 32 has the same dimensions (apart from thickness) as the tunnel barrier layer 12, the free layer 11 and the conductive electrode 6.

A first advantage is the elimination of one critical dimension mask. A second advantage is that the critical layers of the MTJ stack (i.e., the conductive second electrode 6, the free layer 11, the fixed layer 12 and, optionally, reference fixed magnetic layer stack 32) are self-aligned by being formed in a single mask step. A third advantage is the MTJ stack can be placed right over the metallization interconnect 37. This allows a tighter device pitch density. A fourth advantage is that the processes are both fewer in number relative to prior art MTJ formation, lowering process costs, and are compatible with integrated circuit BEOL processing. In other words, the processes are "integration friendly."

An additional advantage is the formation of a design structure for integrating STT MRAM fabrication processes in a BEOL semiconductor integrated circuit design system that may operate on a computer workstation by executing design operations according to operating system software, support files, and design software such as CADENCE or ORCAD.

MRAM as set forth in the disclosure may operate with logic circuitry such as microprocessors. The MRAM may be integrated into devices that employ the microprocessors. For example, the MRAM may be part of a communications device. Of course the MRAM may include other types of circuitry without departing from the scope and spirit of the disclosure.

Although the present disclosure and its advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present application, processes, machines, manufacture, compositions of matter, means, methods, or steps, presently existing or later to be developed that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A magnetic runnel junction (MTJ) structure for magnetic random access memory (MRAM) comprising:
   a substrate comprising a first interconnect metallization;
   a first electrode directly contacting the substrate and being electrically coupled to the first interconnect metallization;
   a plurality of MTJ layers including a first MTJ layer being coupled to the first electrode;
   a second electrode coupled to at least a second of the MTJ layers, the second electrode having a same first lateral dimension as at least some of the MTJ layers other than the first MTJ layer based upon a first mask;
   a third electrode coupled to the second electrode, the third electrode having a same second lateral dimension as the first electrode based upon a second mask; and
   a second interconnect metallization coupled to the third electrode,
   wherein the first MTJ layer has the same second lateral dimension as the first electrode and the third electrode, and the first lateral dimension is different than the second lateral dimension.

2. The MTJ structure of claim 1, further comprising a first dielectric passivation barrier on the plurality of MTJ layers and the second electrode.

3. The MTJ structure of claim 2, in which the at least some MTJ layers comprise a fixed magnetization layer, a tunnel barrier layer, and a ferromagnetic free layer.

4. The MTJ structure of claim 2, in which the at least some MTJ layers comprise a tunnel barrier layer, and a ferromagnetic free layer.

5. The MTJ structure of claim 2, in which the first electrode is tantalum.

6. The MTJ structure of claim 2, further comprising a second dielectric passivation layer deposited over the first electrode, the third electrode, and the substrate.

7. The MTJ structure of claim 6, in which the substrate further comprises a first interlevel dielectric layer.

8. The MTJ structure of claim 3, in which the fixed magnetization layer comprises a synthetic antiferromagnetic layer and an antiferromagnetic layer.

9. The MTJ structure of claim 2, integrated into a spin-torque-transfer (STT) MRAM.

10. The MTJ structure of claim 9, in which the STT MRAM is integrated into at least one semiconductor die.

11. The MTJ structure of claim 9, in which the STT MRAM is integrated into a device selected from the group consisting of a set top box, music player, video player, entertainment unit, navigation device, communications device, personal digital assistant (PDA), fixed location data unit, a microprocessor, and a computer.

12. The MTJ structure of claim 1, in which the plurality of MTJ layers are disposed at least partially over the first interconnect metallization.

13. A magnetic tunnel junction (MTJ) structure for magnetic random access memory (MRAM) comprising:
   a substrate including a first interconnect means;
   a first interconnect means for communicating with a first electrode means;
   the first electrode means directly contacting the substrate and being electrically coupled to the first interconnect means, the first electrode means being substantially planar;
   an MTJ means for storing data coupling to the first electrode means, wherein the MTJ means includes a first MTJ layer;
   a second electrode means for coupling to the MTJ means, the second electrode means having a same first lateral dimension as selected MTJ layers other than the first MTJ layer of the MTJ means based upon a first mask;
   a third electrode means for coupling to the second electrode means, the third electrode means having a same second lateral dimension as the first electrode means based upon a second mask; and
   a second interconnect means for coupling to the third electrode means,
   wherein the first MTJ layer of the MTJ means has the same second lateral dimension as the first electrode means and the third electrode means, and the first lateral dimension is different than the second lateral dimension.

14. The MTJ structure of claim 13, integrated into a spin-torque-transfer (SIT) MRAM.

15. The MTJ structure of claim 14, in which the STT MRAM is integrated into at least one semiconductor die.

16. The MTJ structure of claim 14, in which the STT MRAM and microprocessor are integrated into a device selected from the group consisting of a set top box, music player, video player, entertainment unit, navigation device, communications device, personal digital assistant (PDA), fixed location data unit, and a computer.

* * * * *